(12) United States Patent
Bohr et al.

(10) Patent No.: US 7,510,927 B2
(45) Date of Patent: Mar. 31, 2009

(54) LOCOS ISOLATION FOR FULLY-DEPLETED SOI DEVICES

(75) Inventors: Mark Bohr, Aloha, OR (US); Julie Tsai, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/330,842

(22) Filed: Dec. 26, 2002

(65) Prior Publication Data

US 2004/0124490 A1 Jul. 1, 2004

(51) Int. Cl.
*H01L 21/84* (2006.01)
(52) U.S. Cl. .............. 438/225; 438/165; 438/221; 438/297; 438/426
(58) Field of Classification Search ............ 438/165, 438/225, 297, 362, 425, 426, 444, FOR. 232, 438/221, 296; 257/E21.561, E21.564, 354
See application file for complete search history.

(56) References Cited

U.S. PATENT DOCUMENTS

| | | | | |
|---|---|---|---|---|
| 5,780,352 | A * | 7/1998 | Park et al. | 438/404 |
| 5,981,359 | A * | 11/1999 | Onishi | 438/442 |
| 6,066,576 | A * | 5/2000 | Thakur et al. | 438/787 |
| 6,121,133 | A * | 9/2000 | Iyer et al. | 438/636 |
| 6,277,684 | B1 * | 8/2001 | Hayashi et al. | 438/225 |
| 6,465,324 | B2 * | 10/2002 | Vogt et al. | 438/425 |
| 6,486,038 | B1 * | 11/2002 | Maszara et al. | 438/424 |
| 6,627,511 | B1 | 9/2003 | Racanelli et al. | |
| 2002/0022308 | A1 | 2/2002 | Ahn et al. | |

FOREIGN PATENT DOCUMENTS

| | | | |
|---|---|---|---|
| EP | 0 756 319 | A | 1/1997 |
| JP | 01307241 | A * | 12/1989 |
| JP | 09045678 | A | 2/1997 |
| WO | WO 96/29733 | A | 9/1996 |
| WO | 2004/061946 | A1 | 7/2004 |

OTHER PUBLICATIONS

International Search Report PCT/US 03/39195.

* cited by examiner

*Primary Examiner*—Allan R. Wilson
(74) *Attorney, Agent, or Firm*—George Chen

(57) ABSTRACT

The present invention discloses a method including: providing a substrate; forming a buried oxide layer over the substrate; forming a thin silicon body layer over the buried oxide layer, the thin silicon body layer having a thickness of 3-40 nanometers; forming a pad oxide layer over the thin silicon body layer; forming a silicon nitride layer over the pad oxide layer; forming a photoresist over the silicon nitride layer; forming an opening in the photoresist; removing the silicon nitride layer in the opening; partially or completely removing the pad oxide layer in the opening; removing the photoresist over the silicon nitride layer; forming a field oxide layer from the thin silicon body layer in the opening; removing the silicon nitride layer over the pad oxide layer; and removing the pad oxide layer over the thin silicon body layer.

The present invention also discloses a structure including: a substrate; a buried oxide layer located over the substrate; a thin silicon body layer located over the buried oxide layer, the thin silicon body layer including active areas separated by isolation regions, the isolation regions having a modified bird's beak length that is 30-60% of a thickness of the thin silicon body layer; and a fully-depleted device located in each of the active regions.

4 Claims, 2 Drawing Sheets

US 7,510,927 B2

LOCOS ISOLATION FOR FULLY-DEPLETED SOI DEVICES

BACKGROUND OF THE INVENTION

1. Field of the Invention

The present invention relates to the field of semiconductor integrated circuit (IC) manufacturing, and, more specifically, to an isolation region that is dense and planar, as well as, a method of forming such an isolation region.

2. Discussion of Related Art

Gordon Moore originally suggested in 1964 that the pace of technology innovation would result in the doubling of the number of transistors per unit area on an IC chip every 12 months. By 1975, the trend had changed to a doubling every 18 months. Over the ensuing decades, the semiconductor industry has adhered closely to Moore's Law in improving density for every generation of devices. Maintaining such a schedule has involved the scaling down of the metal oxide semiconductor field effect transistors (MOSFETs) in complementary metal oxide semiconductor (CMOS) circuits by using shorter gate length, thinner gate dielectric, super-steep retrograde wells, triple wells, abrupt source/drain (S/D) junctions, and highly-doped channels.

However, doping the channel to a concentration higher than $10^{18}/cm^3$ tends to degrade carrier mobility and junction characteristics. Tunneling of electrons through the gate dielectric also becomes a problem when the gate dielectric thickness drops below about 1.5 nanometers (nm). Consequently, starting with the 90 nm technology node and continuing with the 65 nm technology node, scaling of planar devices fabricated in bulk silicon substrate has become increasingly hampered by short-channel effects (SCE), such as leakage and threshold voltage, $V_t$, stability.

Thus, even more drastic changes are now required in device structure and manufacturing process in order to address SCE. One significant change is substrate enhancement, such as silicon-on-insulator (SOI) technology, in which a device is built in a thin silicon body located over an embedded layer of oxide. SOI can lower parasitic capacitance and reduce substrate leakage thereby enabling faster switching speeds and lower-voltage operation. Devices built with SOI can maintain a higher drive current, $I_{on}$, than devices built in bulk silicon while minimizing off-state leakage current, $I_{off}$. Lowering threshold voltage allows the SOI thickness to be reduced and reducing the SOI thickness allows much better control over SCE. Threshold voltage, $V_t$, also becomes more constant across different channel lengths below about 0.6 micron (um).

An SOI device is considered to be partially-depleted when the depletion region in the channel below the gate electrode does not extend all the way through the thickness of the silicon body. Unfortunately, the performance gain of partially-depleted SOI devices over standard bulk silicon devices diminishes as the dimensions continue to be scaled down. Partially-depleted SOI devices are also subject to a floating body effect (FBE) which makes circuit design more difficult.

Devices built in SOI change from partially-depleted to fully-depleted when the thickness of the silicon body becomes less than about 40 nm. An SOI device is considered to be fully-depleted when the depletion region extends all the way through the thickness of the silicon body. Fully-depleted SOI devices allow a smaller gate size and more ideal transistor function with very sharp turn-on characteristics.

A mesa isolation process may be used for fully-depleted SOI devices, but such a process is not very planar.

Thus, what is needed is an isolation region that is dense and planar, as well as a method of forming such an isolation region.

BRIEF DESCRIPTION OF THE DRAWINGS

FIG. 2C is also an illustration of a cross-sectional view of an embodiment of a structure including an etched and oxidized LOCOS isolation region on a wafer according to the present invention.

FIG. 3C is also an illustration of a cross-sectional view of an embodiment of a structure including a recessed and oxidized LOCOS isolation region on a wafer according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes various embodiments of a method of forming dense and planar isolation regions in a silicon-on-insulator (SOI) wafer with a Local Oxidation of Silicon (LOCOS) process as well as various embodiments of a structure including active regions separated by such dense and planar isolation regions.

Figure 1:
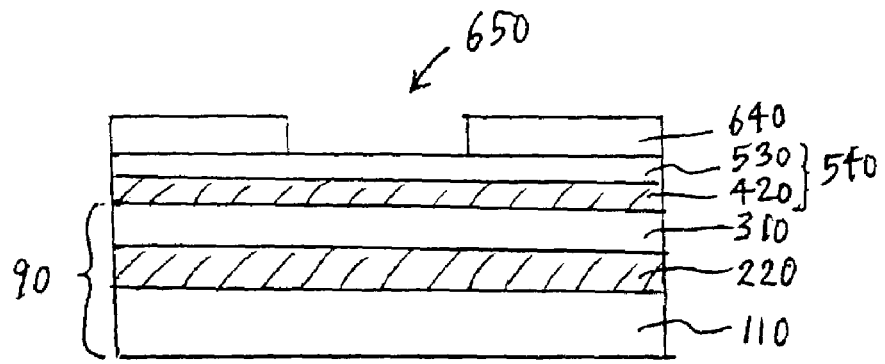
FIG. 1 is an illustration of a cross-sectional view of an embodiment of a method of patterning an isolation region on a wafer according to the present invention.

As shown in an embodiment of the present invention in FIG. 1, a silicon-on-insulator (SOI) wafer 90 includes a thin silicon body 310 that is separated from an underlying silicon substrate 110 by a buried oxide (BOX) layer 220. The BOX layer 220 on the SOI wafer 90 may be formed by either an oxygen implantation process or a layer transfer process. The leading method for oxygen implantation is separation by implantation of oxygen (SIMOX) from Ibis Technology (Danvers, Mass.). SIMOX involves implantation of a high dose (about $2 \times 10^{18}$ ions/$cm^2$) of oxygen at a high energy (about 200 keV) into an SOI wafer 90 that is held at a raised temperature (about 500 degrees Centigrade), followed by a long anneal (about 1,300 degrees Centigrade).

Layer transfer involves growing a BOX layer 220 thermally on a seed wafer and bonding the BOX layer 220 to a handle wafer 110, such that the BOX layer 220 is sandwiched between the two wafers. Then, various processes are available to cleave off most of the seed wafer to be recycled, leaving a thin silicon body 310 located over the BOX layer 220 that is bonded to the handle wafer 110.

SOITEC (Bernin, France) implants hydrogen (about $5 \times 10^{16}$ ions/$cm^2$) through the BOX layer 220 on the seed wafer before chemically bonding the BOX layer 220 to a handle wafer 110, activates the hydrogen thermally (about 500 degrees Centigrade) to form bubbles and cleave off most of the seed wafer, leaving the thin silicon body 310 over the BOX layer 220, anneals the SOI wafer 90 (about 1,100 degrees Centigrade), and performs a chemical-mechanical polish (CMP) to smooth the surface of the thin silicon body 310.

Silicon Genesis, or SiGen, (Campbell, Calif.) bonds the BOX layer 220 on a seed wafer to a handle wafer 110 at room temperature with a low-power plasma process, uses gas pressure to cleave off most of the seed wafer, and uses a chemical vapor etch to finish the surface of the thin silicon body 310.

Canon (Hiratsuka, Japan) deposits a porous silicon layer over a seed wafer, deposits an epitaxial silicon layer over the porous silicon layer, and thermally grows a BOX layer 220 over the epitaxial silicon layer. The BOX layer 22 on the seed wafer is then bonded to a handle wafer 110. A water-jet technique is used to cleave the seed wafer at the porous silicon layer. The porous layer is etched down to the epitaxial silicon layer and a hydrogen annealing process is used to finish the surface of the thin silicon body 310.

Completion of the SOI process results in the SOI wafer 90 that has the thin silicon body layer 310 located over the BOX layer 220 that is, in turn, located over the silicon substrate 110. The thin silicon body layer 310 has a thickness of about 3-40 nanometers (nm). The BOX layer 220 has a thickness of about 30-250 nm. For an SOI wafer 90 with a diameter of 300 mm, the silicon substrate 110 has a thickness of about 778 microns (um).

In one embodiment of the present invention, as shown in FIG. 1, the thin silicon body layer 310 is cleaned and a pad oxide layer 420 is formed thermally at one or more temperatures in a range of about 850-1,150 degrees Centigrade. The oxidizing agent may include O2 (dry), H2O (wet), or H2/O2 (pyrogenic). In an embodiment of the present invention, the pad oxide layer 420 may be formed at high pressure. High pressure may allow the use of a lower oxidation temperature and a shorter oxidation time. In another embodiment of the present invention, the pad oxide layer 420 may be formed with rapid thermal oxidation (RTO), such as an in situ pyrogenic single wafer process, to decrease the thermal budget.

In an embodiment of the present invention, the pad oxide layer 420 has a thickness selected from a range of about 3-8 nm. In another embodiment of the present invention, the pad oxide layer 420 has a thickness selected from a range of about 8-30 nm.

Then, a silicon nitride layer 530 is formed over the pad oxide layer 420. The silicon nitride layer 530 may be formed by chemical vapor deposition (CVD) at about 670-830 degrees Centigrade. The silicon nitride layer 530 may be formed from a reaction of silane and ammonia at atmospheric pressure. Alternatively, the silicon nitride layer 530 may be formed from a reaction of dichlorosilane and ammonia at reduced pressure.

In an embodiment of the present invention, the silicon nitride layer 530 has a thickness selected from a range of about 25-65 nm. In another embodiment of the present invention, the silicon nitride layer 530 has a thickness selected from a range of about 65-150 nm.

The pad oxide layer 420 serves as a stress buffer layer for the overlying silicon nitride layer 530. Otherwise, the high tensile stress in the silicon nitride layer 530 may generate severe crystal dislocations in the underlying thin silicon body layer 310 during subsequent thermal processing.

The processes of photolithography and etch may be used to pattern the isolation layer on the wafer 90. First, a radiation-sensitive material, such as a photoresist 640, may be applied or coated over the silicon nitride layer 530, as shown in an embodiment of the present invention in FIG. 1. Next, an isolation-layer reticle is placed in the path of radiation of the appropriate wavelength, energy, and dose to determine the portion of the photoresist 640 that is to be exposed. The exposure is performed in an imaging tool, such as a wafer stepper or a wafer scanner. Exposure is followed by development of the photoresist 640 to create a mask.

The mask has a feature 650 that corresponds to the exposed portion of the photoresist 640, as shown in an embodiment of the present invention in FIG. 1. The shape and Critical Dimension (CD) of the feature 650 in the photoresist 640 is derived from a design on the isolation-layer reticle. Next, the feature 650 that has been patterned in the photoresist 640 may be transferred into underlying layers.

Figure 2A:
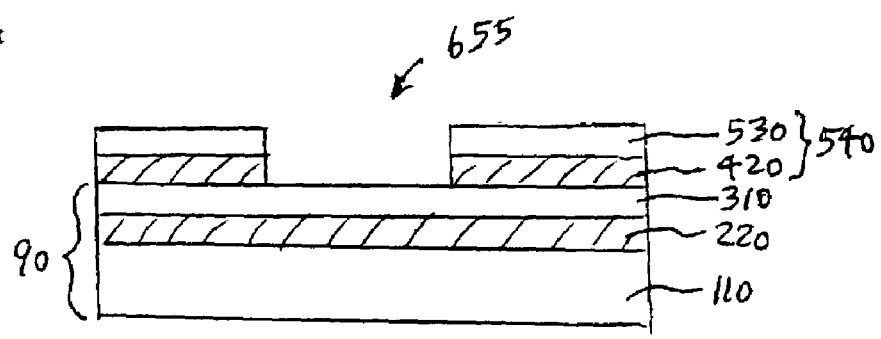
FIGS. 2A-2C are illustrations of a cross-sectional view of an embodiment of a method of etching and oxidizing a LOCOS isolation region on a wafer according to the present invention.

A plasma process, such as a reactive ion etch (RIE), may be used to form an opening 655 in the composite stack 540 of silicon nitride layer 530 over pad oxide layer 420. The silicon nitride layer 530 in the opening 655 is entirely removed while the pad oxide layer 420 in the opening 655 may be partially (not shown) or completely (as shown in FIG. 2A) removed.

In one embodiment of the present invention, a high-density plasma, such as a radio frequency (RF) inductively-coupled plasma (ICP), may be used. The dry etch to form the opening 650 may be performed with a gas mixture that includes an etching gas, such as $CF_4$, and a polymerizing gas, such as $CH_2F_2$. The etching gas serves as the principal source of fluorine for etching while the polymerizing gas improves selectivity by passivating the sidewalls of the opening 650 during the etch. The etch selectivity of the silicon nitride layer 530 and the pad oxide layer 420 relative to the photoresist 640 may be about 20:1 or greater. Other gases that may be used for etching the opening 650 include $C_3F_6$ and $CHF_3$. The etch rate of the silicon nitride layer 530 and the pad oxide layer 420 may be selected from a range of about 30-200 nm per minute.

Figure 2B:
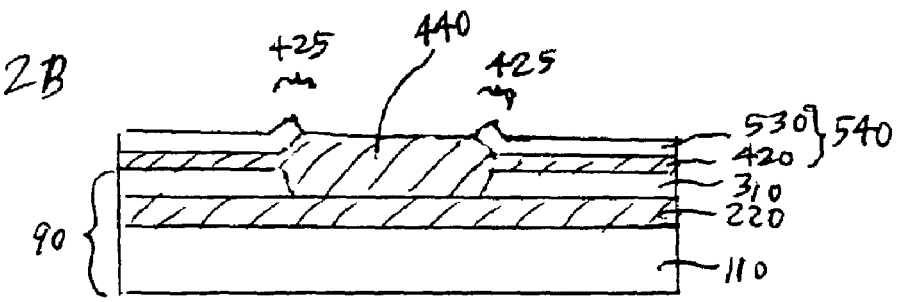

After the photoresist 640 is stripped off, a local oxidation of silicon (LOCOS) process is performed, as shown in an embodiment of the present invention in FIG. 2B. The silicon nitride layer 530 serves as an oxidation mask since oxygen diffuses very slowly through silicon nitride. A field oxide (FOX) layer 440 is formed thermally from the portion of the thin silicon body layer 310 uncovered by the opening 655.

In one embodiment of the present invention, the FOX layer 440 is formed thermally at one or more temperatures in the range of about 850-1,150 degrees Centigrade. The oxidizing agent may include O2 (dry), H2O (wet), or H2/O2 (pyrogenic). In an embodiment of the present invention, the FOX layer 440 may be formed at high pressure. High pressure may allow the use of a lower oxidation temperature and a shorter oxidation time. In another embodiment of the present invention, the FOX layer 440 may be formed with rapid thermal oxidation (RTO), such as an in situ pyrogenic single wafer process, to decrease the thermal budget.

The FOX layer 440 consumes the thin silicon body layer 310 located over the BOX layer 220. Oxidation of the thin silicon body layer 310 may be affected by the underlying BOX layer 220 since the BOX layer 220 is oxide and is not a good thermal conductor. The FOX layer 425 extends laterally below the edges of the silicon nitride layer 530 to form a "bird's beak" 425 in the transition region between the thicker FOX layer 440 and the thinner pad oxide layer 420, as shown in an embodiment of the present invention in FIG. 2B. The bird's beak 425 contributes to lateral encroachment and vertical topography.

The length and height of the bird's beak 425 may be minimized by using an optimized composite stack 540 that includes a thicker silicon nitride layer 530 and a thinner pad oxide layer 420. In an embodiment of the present invention, the ratio of silicon nitride layer 530 thickness to pad oxide layer 420 thickness is about 5:1-8:1. In another embodiment of the present invention, the ratio of silicon nitride layer 530 thickness to pad oxide layer 420 thickness is about 8:1-15:1. In still another embodiment of the present invention, the ratio of silicon nitride layer 530 thickness to pad oxide layer 420 thickness is about 20:1. In a further embodiment of the present invention, the composite stack 540 is formed from other materials that block diffusion of oxygen and are compatible with a LOCOS process.

Figure 2C:
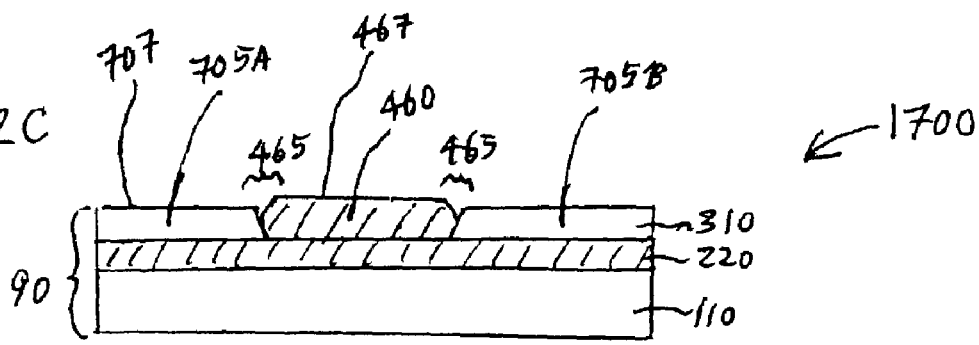

After formation of the FOX layer 440, the composite stack 540 is removed, as shown in an embodiment of the present invention in FIG. 2C. First, buffered hydrofluoric acid may be used to remove a thin layer of oxynitride that may have formed over the silicon nitride layer 530. Next, the silicon nitride layer 530 is removed with hot phosphoric acid at about 180 degrees Centigrade using a reflux boiler. Then, the pad oxide layer 420 is removed with hydrofluoric acid. The result is an isolation region 460 that separates adjacent active regions 705A, 705B. In an embodiment of the present invention, part or all of the composite stack 540 may be removed by a dry etch process.

Thinning down the FOX layer 440 while removing the composite stack 540 will result in a modified bird's beak 465 that is further reduced in length and thickness. In an embodiment of the present invention, the length of the modified bird's beak 465 is about 60-90% of the thickness of the thin silicon body layer 310. However, after removal of the composite stack 540, some topography, such as a depression or seam, may be present and an upper surface 467 of the isolation region 460 may be higher than an upper surface 707 of the active regions 705A, 705B.

FIG. 2C also shows another embodiment of the present invention which is a structure 1700 that includes fully-depleted devices in adjacent active regions 705A, 705B of an SOI wafer 90 that are separated by an isolation region 460 formed by a LOCOS process. A modified bird's beak 465, reduced in length and thickness, is located along the edges of the isolation region 460. In an embodiment of the present invention, the length of the modified bird's beak 465 is about 60-90% of the thickness of the thin silicon body layer 310. Some topography, such as a depression or seam, may be present and an upper surface 467 of the isolation region 460 may be higher than an upper surface 707 of the active regions 705A, 705B.

Thermal oxidation of silicon will increase volume, such as by about 44%. The expansion in volume upon oxidation may depend on various factors, such as crystal orientation, doping level, implant damage, and stress of the silicon, as well as, temperature and type of oxidizing agent used in oxidation. Consequently, in order to compensate for the volume expansion and minimize degradation in surface planarity, the thin silicon body layer 310 uncovered by the opening 650 may be partially recessed by an etch before performing the oxidation. In an embodiment of the present invention, the thickness of the thin silicon body layer 310 in the opening 650 may be reduced by about 30%.

Figure 3A:
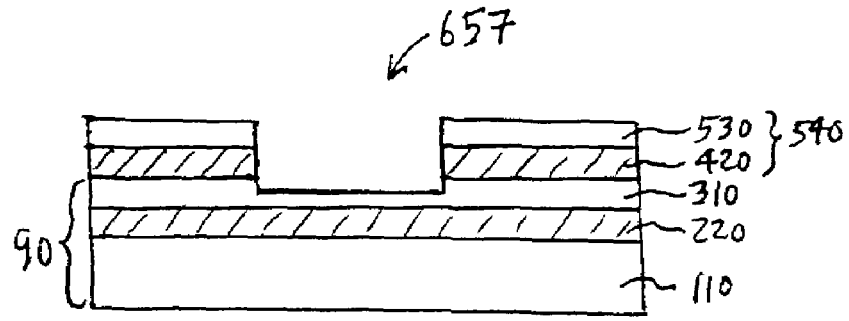
FIGS. 3A-3C are illustrations of a cross-sectional view of an embodiment of a method of recessing and oxidizing a LOCOS isolation region on a wafer according to the present invention.

As shown in an embodiment of the present invention in FIG. 3A, a low-pressure, high-density plasma etch, such as with $Cl_2/Ar$, may be used to etch a trench into the thin silicon body layer 310.

Figure 3B:
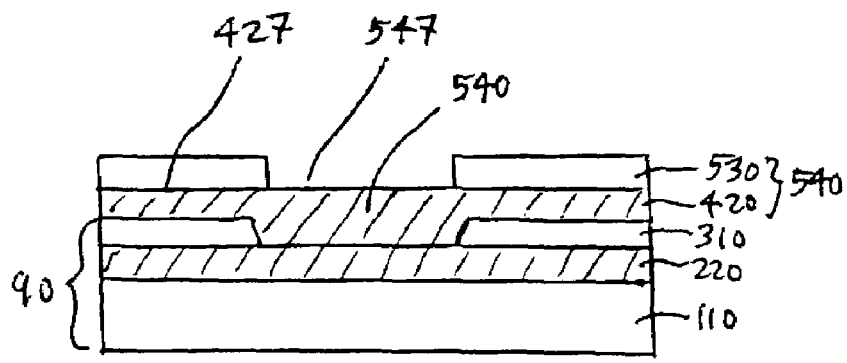

As shown in an embodiment of the present invention in FIG. 3B, if the thin silicon body layer 310 is properly recessed before oxidation, an upper surface 547 of the FOX layer 540 should be relatively level or planar with an upper surface 427 of the thin silicon body layer 310 after oxidation is completed. The modified bird's beak 565 along the edges of the FOX layer 540 is also significantly reduced in length and thickness. Any remaining topography, such as a depression or a seam, should be minimal.

In an embodiment of the present invention, the length of the modified bird's beak 565 is about 30-60% of the thickness of the thin silicon body layer 310 after removal of the composite stack 540. As shown in an embodiment of the present invention in FIG. 3C, an upper surface 567 of the isolation region 560 should be relatively level or planar with an upper surface 807 of the active regions 805A, 805B. In an embodiment of the present invention, the difference in height between the isolation region 560 and the active regions 805A, 805B should be less than about 10% of the thickness of the thin silicon body layer 310.

Figure 3C:
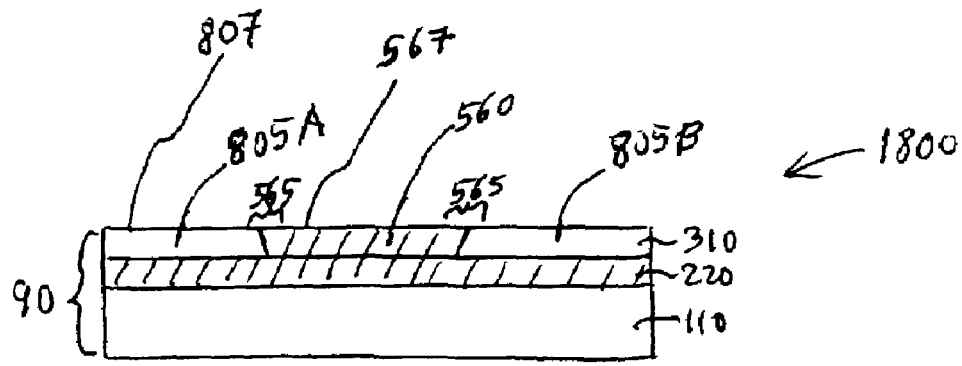

FIG. 3C also shows another embodiment of the present invention which is a structure 1800 that includes fully-depleted devices in adjacent active regions 805A, 805B of an SOI wafer 90 that are isolated by an isolation region 560 formed by a LOCOS process. A modified bird's beak 565, significantly reduced in length and thickness, is located along the edges of the isolation region 560. In an embodiment of the present invention, the length of the modified bird's beak 565 is about 30-60% of the thickness of the thin silicon body layer 310. The upper surface 567 of the isolation region 560 should be relatively level or planar with the upper surface 807 of the active regions 805A, 805B. Thus, the structure 1800 of the present invention has a dense and planar isolation region 560.

In an embodiment of the present invention, a fully-depleted device may be formed in each of the active areas 805A, 805B in a thin silicon body layer 310 as follows:

If desired, a thin layer of sacrificial oxide may be grown over the thin silicon body layer 310 in the active regions 805A, 805B. The sacrificial oxide is etched off to remove any silicon oxynitride that may have formed over the thin silicon body layer 310 near the edges of the silicon nitride (Kooi effect) during LOCOS. Otherwise, the silicon oxynitride may interfere with the subsequent formation of a gate dielectric stack, resulting in thin and nonuniform spots (not shown).

Ultra-low energy ion implantation may be used to adjust the threshold voltage, $V_t$.

A gate dielectric stack may be formed over the thin silicon body layer 310. The gate dielectric stack may have a physical thickness of about 0.6-1.5 nm. In an embodiment of the present invention, the gate dielectric stack may include an amorphous high-k (greater than about 15) material, such as hafnium oxide ($HfO_2$), formed with metal-organic chemical vapor deposition (MOCVD) or atomic layer deposition (ALD).

A gate electrode may be formed over the gate dielectric stack and patterned by photolithography and etch. The gate electrode has a thickness of about 40-65 nm and may be doped polysilicon, or doped polysilicon covered with a metal, or a single metal, or double metal, such as Tantalum or Titanium for NMOS and Tantalum Nitride, Tungsten Nitride, or Titanium Nitride for PMOS. Unlike a doped polysilicon gate electrode, a metal gate electrode is not subject to a depletion effect. In an embodiment of the present invention, the physical gate length may be about 25-50 nm.

Ultra-low energy ion implantation and spike anneal may be used to form extensions to the source and drain on each side of the gate. Tilted implants may be performed if desired. In an embodiment of the present invention, plasma or gas phase doping may be used. The source and drain extensions may have a junction depth of about 10-20 nm.

A sidewall spacer with a thickness of about 25-80 nm may be formed on both sides of the gate. The sidewall spacer may include one or more layers of dielectric materials.

A raised source and drain may be formed next to the sidewall spacer on both sides of the gate with selective epitaxial deposition. The raised source and drain improves silicide formation and reduces parasitic capacitance.

Ultra-low energy ion implantation and spike anneal may be used to dope the source and drain. In an embodiment of the present invention, plasma or gas phase doping may be used. The raised source and drain may have a junction depth of about 20-40 nm.

Nickel silicide (NiSi) with a thickness of about 15-25 nm may be formed over the raised source and drain and, if the gate electrode is doped polysilicon, the gate electrode. The nickel silicide reduces contact leakage and consumes less silicon than cobalt silicide ($CoSi_2$).

An interlayer dielectric (ILD) layer may be formed over the device. The ILD may be formed from a low-k (dielectric constant, k, such as 1.0-2.2) material that is spun on or deposited by CVD, such as organosilicate glass (OSG) or carbon-doped oxide (CDO). The ILD may be porous and may include an air gap. A dual damascene scheme with chemical-mechanical polish (CMP) may be used to form multilayer interconnects to the device with copper metal or alloy. As needed, diffusion barrier layers and shunt layers may be included for the vias and metal lines.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an isolation region that is dense and planar, as well as a method of forming such an isolation region.

We claim:

1. A method comprising:
   providing a silicon-on-insulator wafer, said silicon-on-insulator wafer comprising a buried oxide layer covered by a thin silicon body layer;
   forming a composite stack over said thin silicon body layer, said thin silicon body layer having a thickness of 3-40 nanometers, said composite stack comprising a pad oxide layer covered with a silicon nitride layer, said pad oxide layer having a thickness selected from a range of 3-8 nm, said silicon nitride layer having a thickness selected from a range of 65-150 nm, wherein a ratio of said silicon nitride layer thickness to said pad oxide layer thickness is about 20:1;
   forming a photoresist over said composite stack;
   forming an opening in said photoresist;
   removing said composite stack in said opening while passivating sidewalls of said opening wherein an etch selectivity of said silicon nitride layer and said pad oxide layer relative to said photoresist is 20:1 or greater;
   reducing by about 30% said thickness of said thin silicon body layer in said opening;
   removing said photoresist over said composite stack;
   forming a field oxide layer from said thin silicon body layer in said opening; and
   thinning down said field oxide layer while removing said composite stack over said thin silicon body layer by a dry etch process wherein an upper surface of said field oxide layer is relatively level or planar with an upper surface of said thin silicon body layer and a length of a modified bird's beak is about 30-60% of a thickness of said thin silicon body layer after removal of said composite stack.

2. The method of claim 1 wherein said buried oxide layer comprises a thickness of 30-250 nanometers.

3. The method of claim 1 wherein said field oxide layer is formed at high pressure.

4. The method of claim 1 wherein said field oxide layer is formed with rapid thermal oxidation.

* * * * *